(12) United States Patent
Linder et al.

(10) Patent No.: US 6,552,343 B1
(45) Date of Patent: Apr. 22, 2003

(54) UNIT CELL WITH FAN-OUT FOR LARGE FOCAL PLANE ARRAYS WITH SMALL DETECTOR PITCH

(75) Inventors: Lloyd F. Linder, Agoura Hills, CA (US); Alan E. Reamon, Woodland Hills, CA (US)

(73) Assignee: TelASIC Communications, Inc., El Segundo, CA (US)

( * ) Notice: Subject to any disclaimer, the term of this patent is extended or adjusted under 35 U.S.C. 154(b) by 0 days.

(21) Appl. No.: 09/574,123

(22) Filed: May 18, 2000

(51) Int. Cl.⁷ .................................................. G01J 5/00
(52) U.S. Cl. ................ 250/338.1; 250/332; 250/338.4; 250/370.01
(58) Field of Search ........................... 250/338.1, 332, 250/338.4, 370.01

(56) References Cited

U.S. PATENT DOCUMENTS 4,914,296 A * 4/1990 Reinhold et al. ............ 250/332
5,010,251 A * 4/1991 Grinberg et al. ......... 250/338.1

* cited by examiner

Primary Examiner—Constantine Hannaher
Assistant Examiner—Andrew Israel
(74) Attorney, Agent, or Firm—Morrison & Foerster LLP

(57) ABSTRACT

A unit cell including a substrate; an active circuit disposed on the substrate; and an arrangement disposed on the substrate for routing a plurality of conductors thereover. In the illustrative implementation, the routing arrangement includes first, second and third ground planes disposed on the substrate, a first layer of conductors disposed between the first and second planes, and a second layer of conductors disposed between the second and the third planes. Each cell is adapted to connect to a device such as a detector. The inventive unit cell enables an improved focal plane array design with a smaller unit cell supporting smaller detector sizes. Smaller detector pitch allows higher density detector arrays. The inventive fan-out approach allows for complicated circuitry to be located outside the array. This permits the utilization of more sophisticated analog signed processing, such as a multiple sample approach. Multiple sampling results in a much more accurate digital Gaussian curvefit, which increases the range and intensity accuracy of readout electronics.

6 Claims, 3 Drawing Sheets

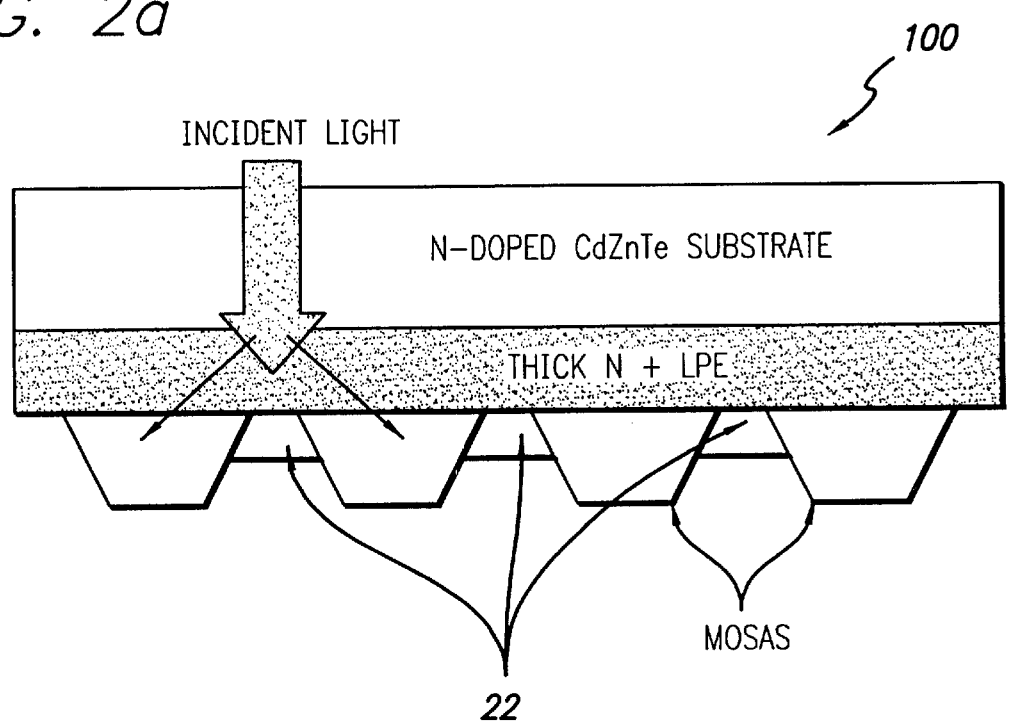
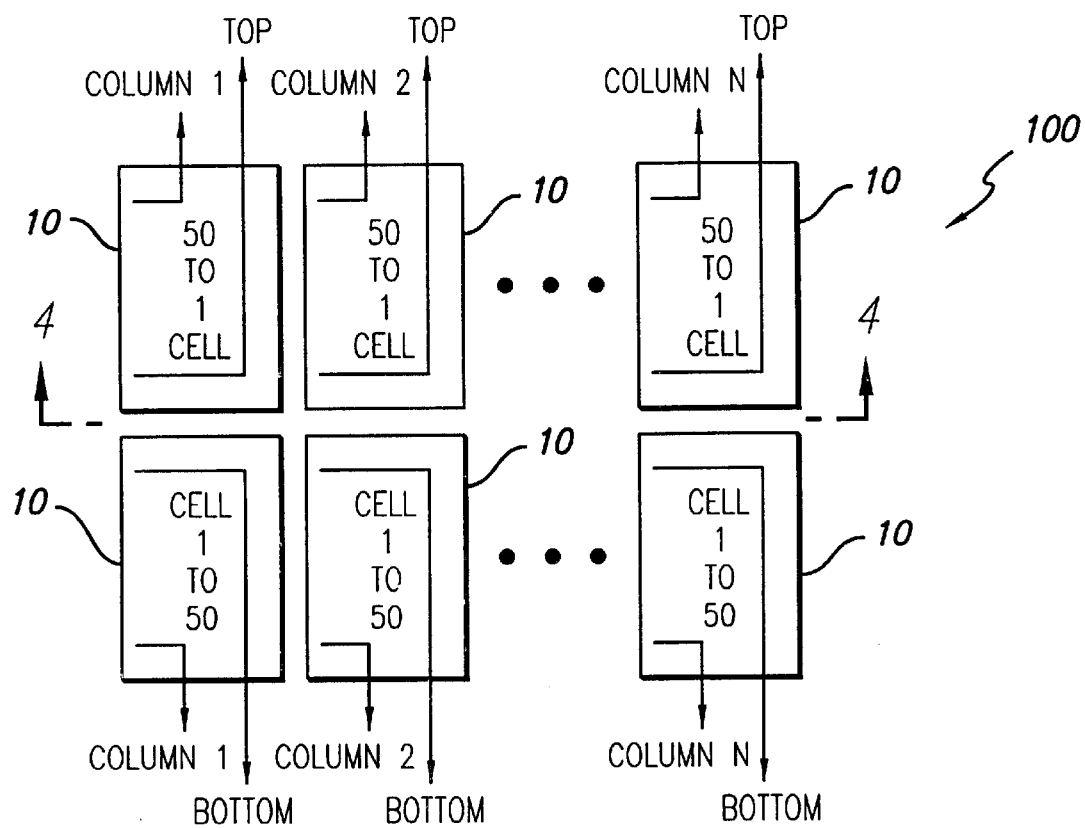

UNIT CELL WITH FAN-OUT FOR LARGE FOCAL PLANE ARRAYS WITH SMALL DETECTOR PITCH

BACKGROUND OF THE INVENTION

1. Field of the Invention

The present invention relates to infrared detectors. More specifically, the present invention relates to readout electronics used in focal plane arrays of infrared detectors.

2. Description of the Related Art

Arrays of detectors are often used in imaging applications. These arrays are disposed in the focal plane of the imaging system and are therefore known in the art as focal plane arrays. Focal plane arrays (FPAs) are particularly useful in infrared imaging applications. For certain applications, small detector pitch (e.g. 25 microns per side) is a critical design parameter. The pitch of the detector relates to the size thereof and allows for high-resolution imaging.

In accordance with conventional teachings, focal plane arrays are typically constructed with on-chip signal processing and contained within the space of the detector area. This has heretofore limited the extent to which the detector could be reduced in size. FPAs with smaller pitch have been proposed, however, these designs force either the analog signal processing outside the array or force the degradation of the resolution achievable for the signal processing contained in the area defined by the detector pitch. Thus, such functions as high speed sampling of the received signals and digitization of same could not be achieved as these functions required a large number of sample and hold (S/H) operations which can not be implemented within the detector pitch.

Hence, the prior art in small pitch focal plane array design suffered from an inability to perform on-chip sample and holds and was limited to simply reading out the received/processed signals in a row/column multiplexed (MUX) fashion on a single signal line. This prior approach was an integration based approach and was generally limited in its ability to perform high resolution signal processing. That is, to achieve small pitch, the intensity of the received waveform was integrated. However, this approach was limited in its ability to detect multiple returns. Further, this prior approach was typically constructed using silicon detectors, mercury-cadmium-telluride detectors or avalanche photodiodes connected to an integrator. The integrators are then multiplexed to a digital signal processor via an analog to digital converter. Unfortunately, this system only outputs intensity data. It provides no indication of is multiple returns, the rise and fall times, the peak intensity (the shape of the received waveform) or the location of the peaks therein.

In short, readout electronics was limited to simple signal processing due to the requirement of maintaining signal processing circuitry inside the unit cell. The output of the circuitry was typically multiplexed either along a column or a row in order to reduce the routing required outside the cell. Multiplexing is slow and does not allow parallel signal processing of the detector outputs.

Hence, there is a need in the art for a system or method for achieving a high density of small detector pitch readout unit cells which allow for high resolution on-chip analog signal processing of a received waveform in a focal plane array.

SUMMARY OF THE INVENTION

The need in the art is addressed by the unit cell of the present invention. The inventive unit cell includes a substrate; an active circuit disposed on the substrate; and an arrangement disposed on the substrate for routing a plurality of conductors thereover. In the illustrative implementation, the routing arrangement includes first, second and third ground planes disposed on the substrate, a first layer of conductors disposed between the first and second planes, and a second layer of conductors disposed between the second and the third planes. Each cell is adapted to connect to a device such as a detector.

The inventive unit cell enables an improved focal plane array design with a smaller unit cell supporting smaller detector sizes. Smaller detector pitch allows higher density detector arrays. The inventive fan-out approach allows for complicated circuitry to be located outside the array. This permits the utilization of more sophisticated analog signal processing, such as the multiple sample approach. Multiple sampling results in a much more accurate digital Gaussian curvefit, which increases the range and intensity accuracy of readout electronics.

BRIEF DESCRIPTION OF THE DRAWINGS

FIG. 2a is a sectional side view of a portion of an array of detectors in accordance with the present teachings showing a back illuminated structure.

FIG. 3 is a top view of a portion the array of unit cells such implemented in accordance with the teachings of the present invention.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
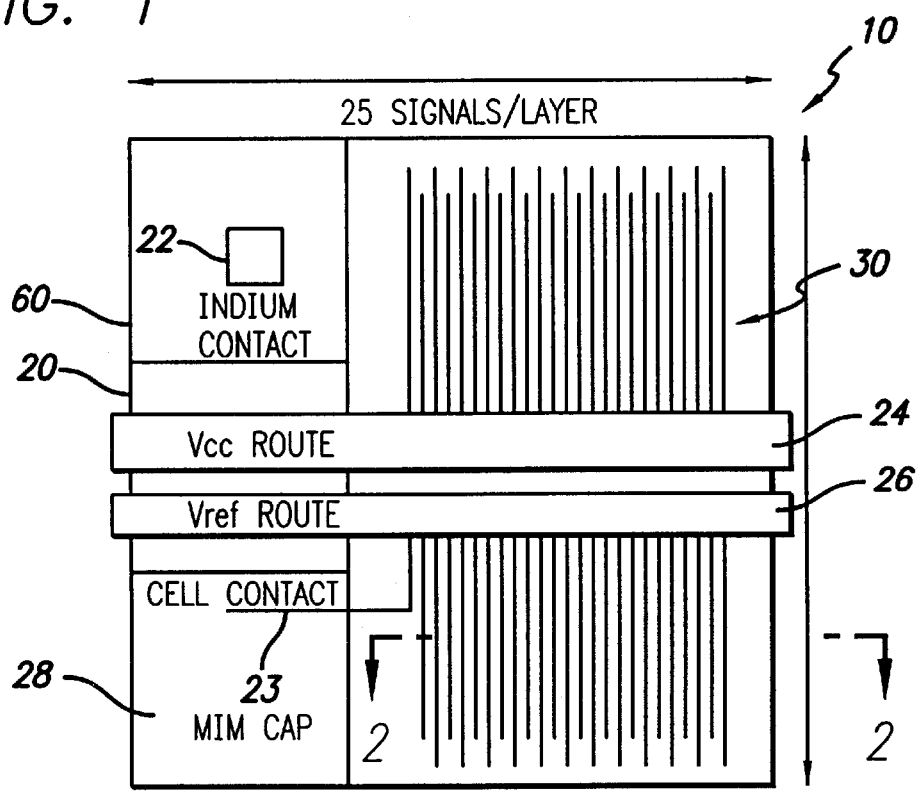
FIG. 1 is a simplified sectional top view of a unit cell constructed in accordance with the teachings of the present invention.

FIG. 1 is a simplified sectional top view of a unit cell constructed in accordance with the teachings of the present invention. The cell 10 is adapted for use in an array 100 (not shown). In FIG. 1, the detector (not shown) and a ground layer are removed to reveal the advantageous design of the present invention. As shown in FIG. 1, the unit cell 10 has an active amplifier circuit 20 on the left side of a route street 30. The route street 30 includes a set of signal lines which communicate a signal, received by a detector (not shown) and amplified by the unit cell 10, outside the array (not shown). The design of the cell 10 is further illustrated with respect to FIG. 2 below.

Figure 2:
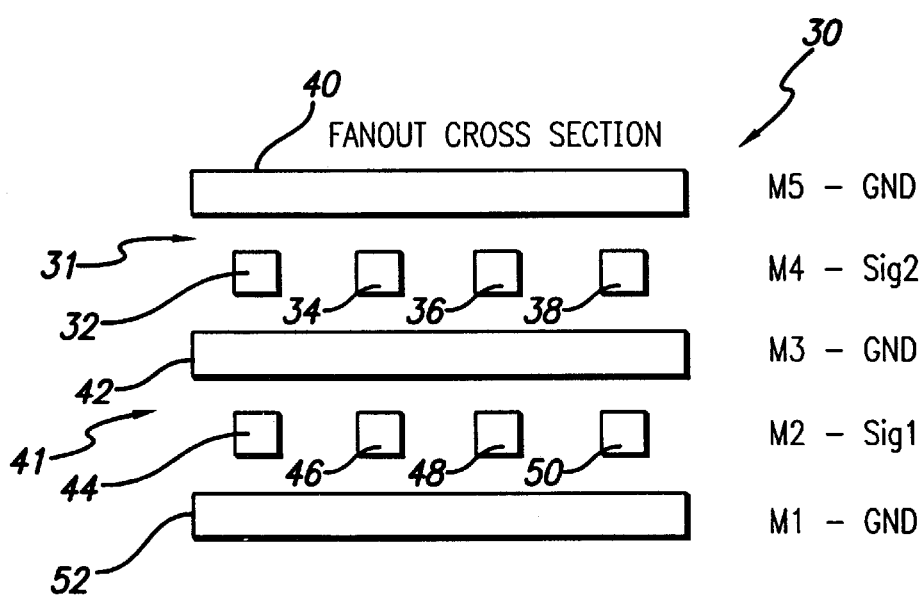
FIG. 2 is a side elevational, cross-sectional view of a portion the route street of the cell depicted in FIG. 1 taken along the line 2—2 thereof and implemented in accordance with the teachings of the present invention.

FIG. 2 is a side elevational, cross-sectional view of a portion of the route street of the cell depicted in FIG. 1 taken along the line 2—2 thereof and implemented in accordance with the teachings of the present invention. As illustrated in FIG. 2, the route street 30 includes plural conductors of which two layers 31 and 41 of conductors of which four are shown in the figure. That is, in the illustrative embodiment, the first layer 31 includes 25 lines of which four conductors are shown 32, 34, 36 and 38. The second layer 41 includes 25 additional lines of which four conductors 44, 46, 48 and 50 are shown. Within each layer, the lines are co-parallel and sandwiched between two ground planes. The first layer 31 is disposed between ground planes 40 and 42. The second layer 41 is positioned between the second ground plane 42 and a third ground plane 52. Those skilled in the art will appreciate that the present teachings are not limited to the number of sets of conductors used nor the number of conductors provided in each set, nor is the invention limited to the number of ground planes used. One or more ground planes may be replaced with signal carrying conductor lines without departing from the scope of the present teachings. Those skilled in the art will also appreciate that the present teachings allow for two separate sets of ground shielded output conductors. Positioned beneath the ground layer is a layer of oxide and a substrate (not shown) as is common in the art.

As illustrated in FIG. 2a, in the preferred embodiment, the detectors are implemented on separate substrates which are flip-chip connected through an indium bump contact. Depending on the detector material used, rows of detectors may be provided on separate substrates that are contacted individually to the array through the bump contacts.

Returning to FIG. 1, the contact 22 of indium or other suitable material is included to make contact with the detector (not shown). In the illustrative embodiment, the detector is an infrared detector. The active circuit 20 further includes an analog pre-amplifier amplifier 60 disposed beneath the contact 22. The amplifier 60 is connected to the array 30 via a cell connect line 23. A supply bus 24 extends over the active circuit 20 and the array 30. In addition, a second bus 26 is included to supply a reference voltage $V_{ref}$ to the active circuit 20. A capacitor 28 is included in the active circuit 20 and place on top of other devices therein to conserve space. In the preferred embodiment, the capacitor 28 is a metal-insulator-metal (MIM) type capacitor. Internal cell connections can be made using the multi-layer metal layers, below the MIM capacitor 28.

FIG. 3 is a top view of a portion the array of a portion an array of unit cells such implemented in accordance with the teachings of the present invention. The array 100 includes N columns of 100 cells 10 of which six are shown in the figure. Thus, the array 100 provides 100×N external high-frequency signal connection paths. The cells are adapted to pass through the lines connected to the other cells in the array 100 This is depicted more clearly in FIG. 4.

Figure 4:
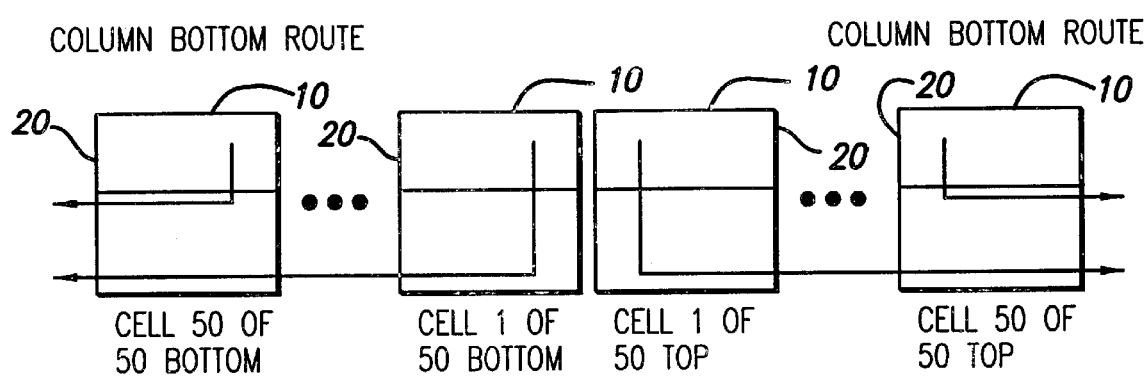
FIG. 4 is a cross-sectional view of a portion of the array of FIG. 3 taken along the line 4—4 thereof.

FIG. 4 is a cross-sectional view of a portion of the array of FIG. 3 taken along the line 4—4 thereof. The dark portion of each unit cell 10 represents the active circuit thereof. Signals are removed from the cell 10 by first being routed outside the array 30. Power, ground and detector bias ($V_{Ref}$) flow independently through the shield layers.

In the illustrative embodiment, the signals are then sampled using multiple analog sample-hold circuits outside the array. Next, the sampled signals are multiplexed at a slow rate by a multiplexer into an analog-to-digital (A/D) converter. The A/D converter then sends the data off-chip to a signal processor. In a preferred embodiment, the on-chip analog signal processing scheme described above is implemented in accordance with the teachings of copending U.S. patent application Ser. No. 09/330,953, filed Jun. 11, 1999, by J. Allen and K. McCormack and entitled HIGH SPEED MULTISAMPLING APPROACH FOR ROIC, the teachings of which are hereby incorporated herein by reference.

Smaller array sizes may not require as many external connects and the unused route area could be utilized for current source biasing and clock circuitry for the sampling, capacitor or more signal processing circuitry.

The inventive array 100 permits individual bias adjustment of each detector in the array, a much reduced detector unit cell physical size and the ability to use differing approaches to the analog signal processing outside the array, thus enhancing design flexibility. The active amplifier is not separately shown. It is applied uniquely to allow a large variation in the $V_{REF}$ value (the detector bias). This is important because it allows a large range of adjustment for the detector bias, which allows optimization of each individual detector's performance.

The inventive approach supports both higher resolution and more sophisticated processing schemes by moving the processing exterior to the unit cell. The present invention therefore allows for the use of new and more advantageous detector readout analog signal processing techniques previously not possible due to limitations on unit cell size such as a multi-sampling technique exterior to the detector array.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A unit cell for a detector comprising:
   a substrate;
   an active circuit disposed on said substrate; and
   means disposed on said substrate for routing a plurality of conductors thereover, wherein said means for routing includes
      first, second and third ground planes disposed on said substrate,
      a first layer of conductors disposed between said first and second ground planes, and
      a second layer of conductors disposed between said second and said third ground planes.

2. The invention of claim 1 including means for connecting said active circuit to a device.

3. The invention of claim 2 wherein said device is a detector.

4. The invention of claim 3 wherein said device is an infrared detector.

5. A focal plane array comprising:
   a plurality of detectors disposed on a substrate;
   a plurality of unit cells, each cell being connected to a respective one of said detectors and including:
      an active circuit disposed on said substrate; and
      means disposed on said substrate for routing a plurality of conductors thereover, said means for routing including:
         first, second and third ground planes disposed on said substrate,
         a first layer of conductors disposed between said first and second ground planes, and a second layer of conductors disposed between said second and said third planes.

6. A method for detecting signals including the steps of:

mounting a plurality of detectors on a substrate;

connecting a plurality of unit cells to a respective one of said detectors; and routing a plurality of conductors through said unit cells with a first layer of conductors disposed between first and second ground planes and a second layer of conductors disposed between second and third planes.

* * * * *